United States Patent [19]

Reinhardt et al.

[11] Patent Number: 4,926,285
[45] Date of Patent: May 15, 1990

[54] ELECTROSTATIC DISCHARGE SIMULATOR WITH HIGHLY REPRODUCIBLE WAVE-FRONT

[75] Inventors: Nicholas Reinhardt, Lexington; Geoffrey M. Weil, Cambridge, both of Mass.

[73] Assignee: KeyTek Instrument Corp., Wilmington, Mass.

[21] Appl. No.: 212,954

[22] Filed: Jun. 29, 1988

[51] Int. Cl.$^5$ ............................................. H01T 23/00
[52] U.S. Cl. .................................... 361/230; 361/235; 324/457
[58] Field of Search ............... 361/230, 235; 335/151; 324/455, 357

[56] References Cited

U.S. PATENT DOCUMENTS

| | | | |
|---|---|---|---|
| 3,891,950 | 6/1975 | DeLocia | 335/151 |
| 4,742,427 | 5/1988 | Richman | 361/230 |
| 4,785,373 | 11/1988 | Dash | 361/235 |
| 4,803,594 | 2/1989 | Zugravu | 361/230 |
| 4,875,133 | 10/1989 | Kawamura | 361/230 |

OTHER PUBLICATIONS

P. Richman and A. Tasker, ESD Testing: Interface Between Simulator and Equipment Under Test, Proceedings of the 6th EMC Symposium, Zurich 1985.

Primary Examiner—Bruce A. Reynolds
Assistant Examiner—Leon K. Fuller
Attorney, Agent, or Firm—Schiller, Pandiscio & Kusmer

[57] ABSTRACT

Current injection electrostatic discharge equipment that includes a discharge capacitor connected to the input terminal of a sulfur-hexafluoride filled relay for selectively applying a current discharge to a test tip, the wave shape of the current discharge being highly repeatable.

9 Claims, 2 Drawing Sheets

ELECTROSTATIC DISCHARGE SIMULATOR WITH HIGHLY REPRODUCIBLE WAVE-FRONT

This invention relates to electronic test equipment, and more particularly to current injection electrostatic discharge (ESD) simulator equipment in which the current wave shape unidirectional spike test surges or impulses applied to equipment under test (EUT) by a surge generator are shaped to match a standardized waveform.

ESD is the most common cause of failure in computer-based equipment, accounting for millions of dollars in downtime and repairs costs. Catastrophic failure due to ESD is preventable, and many manufacturers have programs to insure that their products are ESD-resistant when shipped.

Adequate ESD suppression can be reasonably assured in equipment such as computers and microprocessor-based electronics, by ESD testing during design, production and quality assurance phases of manufacture. Without ESD suppression and thorough verification of its effectiveness, modern, sensitive electronics will often fail in service when subjected to electrostatic discharge resulting from charged humans or mobile objects contacting the equipmemt and discharging into the latter.

In order to test computers and other electronic equipment for susceptibility to ESD, machines or generators that simulate ESD have been developed, and are available commercially. Such test generators typically provide discharges with open-circuit voltage peaks in excess of 8–10 kv for relay-switched current injection, and short-circuit current peaks as high as 50–100 amperes. Such discharges are provided to a test tip held in direct physical and electrical contact with an electrically conductive point on the equipment under test. Such discharges are provided generally through switching means such as a relay, as a series of voltage and current pulses with current-wave durations of typically 20 to 100 nanoseconds. In ESD testing it is highly desirable that the waveforms of the discharges be as repeatable as possible in order to insure that a particular test result is not the consequence of some unexpected frequency or amplitude component of the discharge.

To further the goal of repeatable current waveforms for ESD simulators, standards organizations have developed, and are continuing to develop, criteria for the wave shapes of the currents to be injected by the ESD simulator. A typical standard ESD waveform 20 shown in FIG. 1 (in the present International Electrotechnical Commission draft revision of the ESD standard in Section 801.2), consists of a relay-triggered initial spike 22 with a rapid rise time (e.g. about 700 picoseconds), spike 22 being followed by a slowly decaying current 24.

B. Daout and H. Ryser, in a paper presented at the EMC Symposium in Zurich in March 1985, suggested the use of a relay to trigger the discharge. Subsequently, in another paper contributed to a meeting of the International Electrotechnical Commission at Karlsruhe between 18 and 22 November 1985, they discussed the use of mechanical relays, mercury-wetted reed relays and high voltage vacuum relays, concluding that while all operated in a fast discharge mode very regularly and with fast rising slopes, the high voltage vacuum relay provided the highest working voltage limit.

The rise times originally reported by Daout and Ryser, e.g. to reach a discharge value of 6 to 8 kv using a high voltage vacuum relay, was about 1 nanosecond. Present relay-triggered, commercially available ESD simulation equipment is capable of providing very fast discharges with rise times of less than a nanosecond. While ESD simulation triggered by high voltage vacuum relays is, however, a substantial improvement over earlier devices, it has now been found that a number of successive discharges from an ESD simulator triggered by such a vacuum relay in fact still shows substantial variations in amplitude, rise times, and wave form. The reproduction of a photograph labeled FIG. 2, shows a plot of superimposed current waveforms of twenty, successive, 4 kv discharges from an ESD simulator triggered by a high voltage vacuum relay at a 20/sec repetition rate, the ordinate of FIG. 2 being 5 amperes/division and the abscissa being 10 nanoseconds/division. It is immediately apparent from FIG. 2 that the waveforms are not truly stable in the sense of being substantially repeatable.

It is therefore a principal object of the present invention to provide a relay-triggered ESD generator that will, with a high degree of repeatablity, provide discharges with rise times more closely approximating true ESD waveforms. Another object of the present invention is to provide such a relay-triggered ESD simulator that will provide discharge waveforms with rise times in the sub-nanosecond range.

Other objects of the invention will in part be obvious and will in part appear hereinafter. The invention accordingly comprises the apparatus possessing the construction, combination of elements and arrangement of parts, and the process involving the several steps and their relation and order, all of which are exemplified in the following detailed disclosure and the scope of the application of which will be indicated in the claims. For a fuller understanding of the nature and objects of the present invention, reference should be had by way of example to the following detailed description taken in connection with the accompanying drawings wherein:

Figure 1:
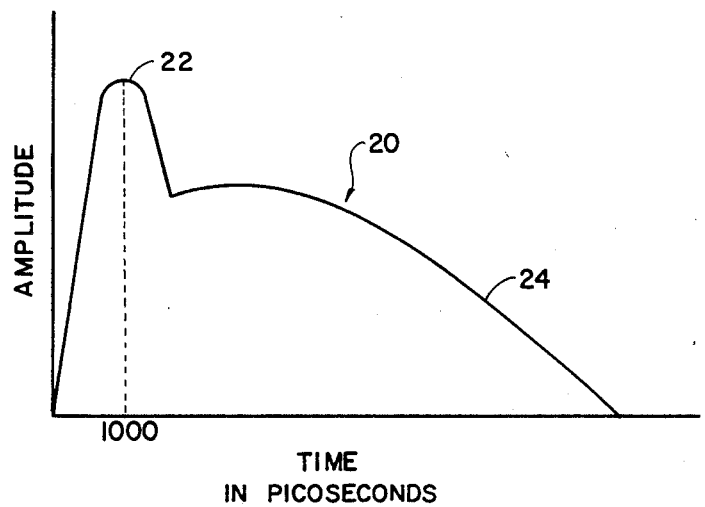
FIG. 1 is a plot of a typical standard ESD waveform according to the present International Electrotechnical Commission draft revision of the ESD standard in Section 801.2.

As noted above, fast rise-time, relay-triggered pulse circuits operating at high voltages (e.g. from less than 2 to 10 kv), have heretofore been plagued with unacceptably large pulse-to-pulse variations in peak voltage and related degradation of pulse shape. It has now been found that these problems are due in large part to the nature of the high voltage vacuum type relays typically used to switch the circuits. Such high-voltage, vacuum relays, exemplified by a Model HC-2 single-pole, double-throw relay made by Kilovac Corporation of Santa Barbara, California, are rated for hot-switching pulse currents of up to 25 amperes. The contact closure characteristics of such relays during the first few picoseconds of operation, not being important in common pulse applications, were unknown and not investigated. Upon investigation, closure characteristics of such vacuum relays have been found to be variable and relatively short-lived, and degradation, when it occurs, is permanent and not readily detectable with ordinary instrumentation. The mechanism responsible for such degradation remains obscure, although switch contact closure characteristics have been exhaustively investigated for over a century. A huge body of information has been developed on the effect of contact materials, tarnish films, closing force, contact-bounce, pre-closure breakdown between approaching contacts in gas and high vacuum, contact "floating" and the like, but none of that information appears to cover the first tens or hundreds of picoseconds of the current flow.

It has now been found that uniformity of pre-closure breakdown characteristics in such relays can be achieved by providing a relay atmosphere of a pressurized gas having an appropriate dielectric strength. The precise mechanism that reduces the variability of these characterictics is not known, but it can be hypothesized that it may be due to any of a number of factors such as, but not limited to, minimization of the interval between pre-closure breakdown and ultimate closure, or shortening of the burning time of pre-closure breakdown by quenching the arc by cooling or deionizing the arc by attaching electrons, or swamping of the effects of ordinary gases (e.g. water, $CO_2$, CO and the like) possibly released by the metal contacts during pre-closure arcing.

It is known that high voltage standoff for ordinary gross switching requirements can be obtained with gas-gap relays. Relay manufacturers have for many years offered gas-filled devices for this purpose. For example, Kilovac Corporation offers a gas-filled relay for controlling discharges in defibrillation equipment, but pulses from such defibrillation devices have durations of many milliseconds and rise times that are certainly not in the sub-nanosecond range. Gas-filled circuit breakers are well known in the art, as are other gas-filled relays exemplified by those disclosed, for example, in U.S. Pat. Nos. 3,604,870; 4,039,984; 4,506,244; and 4,638,275. Nowhere, however, to the knowledge of the inventors hereof, has it been suggested or taught that an ambient pressurized gas atmosphere can provide control of electrical contact behavior during the first tens or hundreds of picoseconds of current flow.

The principles of the present invention are generally embodied in apparatus that is an improvement over prior art circuitry for applying ESD simulated pulses from a test tip held in physical and electrical contact with a conductive point on to equipment under test, in that the switch contacts in the switching means or relay, used to trigger the discharge from the circuit of the present invention, are disposed within a high dielectric strength gas (e.g. sulfur hexafluoride ($SF_6$) under pressure. Such prior art circuitry typically includes discharge capacitor means to hold the necessary electrical charge. The capacitor is series connected through a first RL circuit to an input terminal of the switching means of the present invention, for selectively applying a series of discharges from the capacitor to the test tip.

The present invention can be described in detail in connection with such a circuit designed particularly to provide very fast rise times and shown in FIG. 3 as comprising capacitor 30, one plate of which is connected to ground. The other plate of capacitor 30 is coupled to input terminal 32 of relay switch 34 through any of a number of filter circuits exemplified by series-connected resistor 36 and inductor 38.

Relay switch 34, as noted, is a gas-filled relay, typically charged with $SF_6$ at an elevated pressure, such as 50 lbs/in$^2$. Other gases that are believed suitable for relays used in the present invention include but should not be considered limited to carbon tetrachloride, trichloromethane, difluorodichloromethane, trichlorofluoromethane, and other halogenated lower alkyls and sulfur containing gases, such as $CSF_8$, all of high dielectric strength (i.e. at least about twice as strong) relative to air at atmospheric pressure. Air too may serve as the pressurized gas, but only at a pressure sufficiently high enough to confer the desired dielectric strength. The term "dielectric strength" as used herein is intended to mean the maximum electrical potential gradient a gas can withstand without breakdown. A number of such relays are commercially available.

Figure 3:
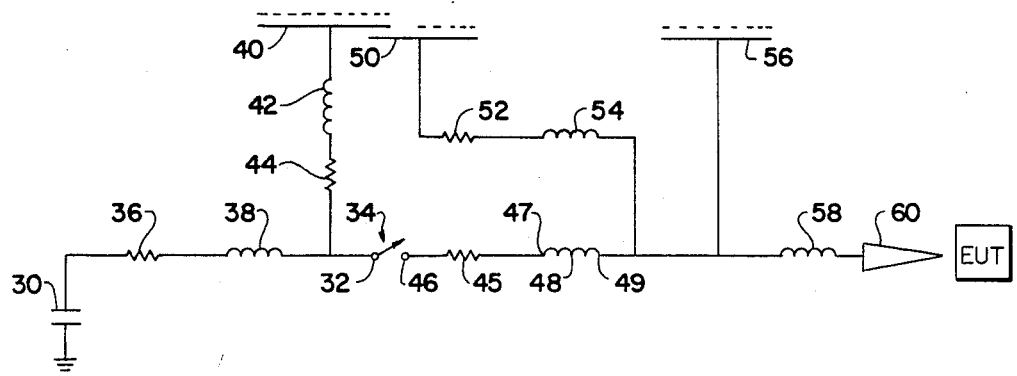
FIG. 3 is a circuit schematic, partly in block form, embodying the principles of the present invention.

While the principles of the present invention can be advantageously incorporated into any of a number of prior art ESD simulator circuits, the preferred embodiment, shown in FIG. 3, is particularly desirable in that it provides a carefully shaped wave-form that conforms closely to true ESD discharges. Such a circuit includes another capacitance, exemplified by plate 40 to provide a charge that aids in shaping the initial discharge spike upon switching. The impedance of the connection for added plate 40 will of course include stray and possibly actual circuit inductance and resistance shown schematically and respectively at 42 and 44. The connection of plate 40 to the discharge circuit is made through this low inductance and low resistance path which limits the impedance in series with one side of capacitance provided by plate 40.

The added capacitance provided by plate 40 is preferably a "free space" capacitance. Essentially the other "plate" of a free space capacitor is the rest of the world. Consequently, single plate 40 of the free space capacitance is shown in solid line and the other "plate" is shown in dotted line. This other "plate" of a free space capacitor is connected purely by a capacitance coupling. The equipment under test (EUT) is, of course, part of the surroundings to which the free space capacitor is coupled in this purely capacitive manner; therefore the discharge current would tend to flow in a loop which includes the EUT.

To control the rise time of the desired waveform, it may be desirable to include inductor 48, one end 47 of which is connected to terminal 46 of switch 34 and the other end 49 of which is coupled to the EUT, as shown in FIG. 3. In addition, there may be provided a shunt capacitance to achieve an LC filter configuration. This shunt capacitance is provided as capacitor plate 50, at least a portion of which is disposed opposite to and adjacent plate 40 so as to shunt a portion of the spike current from the switch capacitance to free space capacitance provided by plate 40. Plate 50 is conductively connected to the other end of inductor 48 through series-connected resistor 52 and inductor 54. It will be appreciated that in certain configurations, the small values of resistance and inductance of resistor 52 and inductor 54 can be provided simply by the stray resistance and stray inductance of the wiring of the circuit, as well as by actual discrete physical components. Plate 50 is also shaped to provide some free space capacitance of its own.

There is also provided an additional free space capacitor, usually of small value, in the form of capacplate 56 connected to end 49 of inductor 48. Free space capacitor plate 56 in conjunction with another small inductor 58 connected between end 49 and conductive test tip 60 forms another LC filter that eliminates unwanted parasitic waveform anomalies from the rising portion of the ESD simulator waveform. In some cases, inductor 58 can be simply the stray inductance of the wiring between end 49 and tip 60. It will be appreciated that the free space capacitance of plate 54 includes the EUT as part of the other "plate" and thus serves also to compensate for the part of the free space current shunted away from the EUT by capacitor plate 50.

Other specific details of the foregoing embodiment of the circuit preferred for incorporating the present invention are described in copending U.S. patent application Ser. No. 160,645 filed Feb. 26, 1988 now U.S. Pat. No. 4,803,594.

Figure 2:
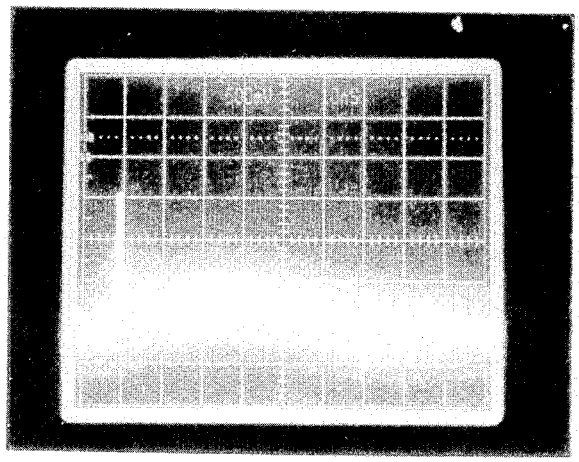
FIG. 2 is a reproduction of a photograph of an amplitude/time graphical representation on an oscilloscope of a succession of discharges from a vacuum relay-triggered ESD simulator.
Figure 4:
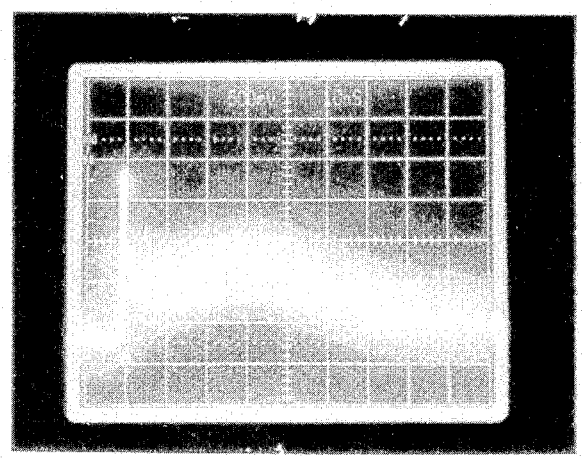
FIG. 4 is a reproduction of a photograph of an amplitude/time graphical representation on an oscilloscope of a typical waveform developed by ESD simulation equipment having the circuit of FIG. 3.

In operation of the circuit of the present invention in which relay switch 34 was filled with sulfur hexafluoride at a pressure of about three to four atmospheres, the circuit was repeatedly switched (20 times) at a repetition rate of 20/sec to provide a series of successive discharges that were displayed on a Tektronix, one gigahertz oscilloscope Model No. 7104. A reproduction of a photograph of the face of the oscilloscope showing the superimposed waveforms of the successive discharges appears as FIG. 4 herein, the ordinate of FIG. 4 being 5 amperes/division and the abscissa being 10 nanoseconds/division. It is clear from FIG. 4 that the waveforms provided by the simulator of the present invention are considerably more stable and repeatable than the waveforms of the prior art as illustrated in FIG. 2, while preserving the very high speed (e.g. less than 1 nanosecond) rise times.

Since certain changes may be made in the abovedescribed apparatus without departing from the scope of the invention herein involved, it is intended that all material contained in the above description or shown in the accompanying drawing shall be interpreted in an illustrative and not in a limiting sense.

What is claimed is:

1. In an apparatus for applying to equipment under test a test electrostatic discharge through a conductive test tip in direct physical and electrical contact with an electrically conductive point on said equipment, said apparatus including a discharge capacitor series-connected through a filter circuit to an input terminal of switching means for selectively applying a discharge from said capacitor to said test tip, the improvement wherein:
said switching means comprises a relay, the contacts of which are disposed in an atmosphere of a pressurized gas having a high dielectric strength relative to air at atmospheric pressure.

2. In apparatus as defined in claim 1, the improvement wherein said dielectric strength is at least about twice that of air at atmospheric pressure.

3. In apparatus as defined in claim 1, the improvement wherein said gas is at a pressure of about three to four atmospheres.

4. In apparatus as defined in claim 1, the improvement wherein said gas comprises sulfur hexafluoride.

5. In apparatus as defined in claim 4, the improvement wherein said gas is at a pressure of about 50 lbs/in$^2$.

6. A method of applying a test electrostatic discharge from a discharge capacitor through switching means to an electrically conductive test tip in direct physical and electrical contact with an electrically conductive point on equipment under test, said method including the step of:
controlling pre-closure behavior of the contacts of said switching means by maintaining said contacts within an atmosphere of a pressurized gas having a high dielectric strength relative to air at atmospheric pressure.

7. The method as defined in claim 6, wherein said gas is at a pressure of about three to four atmospheres.

8. The method as defined in claim 6, wherein said gas comprises sulfur hexafluoride.

9. The method as defined in claim 6, wherein said dielectric strength is at least about twice that of air at atmospheric pressure.

* * * * *